(12) United States Patent
Vaudo et al.

(10) Patent No.: US 7,915,152 B2
(45) Date of Patent: Mar. 29, 2011

(54) III-V NITRIDE SUBSTRATE BOULE AND METHOD OF MAKING AND USING THE SAME

(75) Inventors: Robert P. Vaudo, Cary, NC (US);
Jeffrey S. Flynn, Wake Forest, NC (US);
George R. Brandes, Raleigh, NC (US);
Joan M. Redwing, Phoenix, AZ (US);
Michael A. Tischler, Phoenix, AZ (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/698,144

(22) Filed: Feb. 2, 2010

(65) Prior Publication Data

US 2010/0289122 A1    Nov. 18, 2010

Related U.S. Application Data

(60) Continuation of application No. 10/369,846, filed on Feb. 19, 2003, now Pat. No. 7,655,197, which is a division of application No. 09/524,062, filed on Mar. 13, 2000, now Pat. No. 6,596,079.

(51) Int. Cl.
| | |
|---|---|
| *B01D 9/00* | (2006.01) |
| *A61L 2/00* | (2006.01) |
| *C30B 23/00* | (2006.01) |
| *C30B 29/38* | (2006.01) |
| *H01L 21/00* | (2006.01) |
| *H01L 21/44* | (2006.01) |
| *H01L 21/31* | (2006.01) |
| *H01L 33/00* | (2006.01) |
| *H01L 29/04* | (2006.01) |
| *B32B 19/00* | (2006.01) |

(52) U.S. Cl. ......... 438/512; 422/1; 422/251; 422/245.1; 422/292; 422/307; 437/39; 437/100; 437/106; 437/48; 117/97; 117/88; 117/87; 117/952; 117/90; 117/95; 438/46; 438/604; 438/605; 438/607; 438/608; 438/787; 257/615; 257/103; 257/201; 257/627; 428/698

(58) Field of Classification Search .............. 422/1, 251, 422/245.1, 292, 307; 437/39, 100, 106, 48; 117/97, 88, 87, 952, 90, 95; 438/46, 604–605, 438/607–608, 787; 257/615, 103, 201, 627; 428/698
See application file for complete search history.

(56) References Cited

U.S. PATENT DOCUMENTS 3,598,526 A    8/1971    Huml et al.
(Continued)

FOREIGN PATENT DOCUMENTS

EP    0444630 A1    9/1991
(Continued)

OTHER PUBLICATIONS

Popovici, Galina, "Transmuation Doping of III-Nitride", "Materials Research Society", 1999 symposium, Mat. Res. Soc. Symp. Proc. vol. 572, pp. 519-522.*

(Continued)

*Primary Examiner* — Jill Warden
*Assistant Examiner* — Monzer R Chorbaji
(74) *Attorney, Agent, or Firm* — Vincent K. Gustafson; Hultquist IP

(57) ABSTRACT

A boule formed by high rate vapor phase growth of Group III-V nitride boules (ingots) on native nitride seeds, from which wafers may be derived for fabrication of microelectronic device structures. The boule is of microelectronic device quality, e.g., having a transverse dimension greater than 1 centimeter, a length greater than 1 millimeter, and a top surface defect density of less than $10^7$ defects $cm^{-2}$. The Group III-V nitride boule may be formed by growing a Group III-V nitride material on a corresponding native Group III-V nitride seed crystal by vapor phase epitaxy at a growth rate above 20 micrometers per hour. Nuclear transmutation doping may be applied to an (Al,Ga,In)N article comprises a boule, wafer, or epitaxial layer.

27 Claims, 5 Drawing Sheets

U.S. PATENT DOCUMENTS

| | | | |
|---|---|---|---|
| 3,607,014 | A | 9/1971 | Huml et al. |
| 3,634,149 | A | 1/1972 | Knippenberg et al. |
| 4,129,463 | A * | 12/1978 | Cleland et al. ............... 136/258 |
| 4,144,116 | A | 3/1979 | Jacob et al. |
| 5,006,914 | A | 4/1991 | Beetz et al. |
| 5,030,583 | A | 7/1991 | Beetz et al. |
| 5,204,314 | A | 4/1993 | Kirlin et al. |
| 5,536,323 | A | 7/1996 | Kirlin et al. |
| 5,679,152 | A | 10/1997 | Tischler et al. |
| 5,770,887 | A | 6/1998 | Tadatomo et al. |
| 5,858,086 | A | 1/1999 | Hunter |
| 5,909,036 | A | 6/1999 | Tanaka et al. |
| 5,954,874 | A | 9/1999 | Hunter |
| 6,027,988 | A | 2/2000 | Cheung et al. |
| 6,136,093 | A | 10/2000 | Shiomi et al. |
| 6,156,581 | A | 12/2000 | Vaudo et al. |
| 6,177,292 | B1 | 1/2001 | Hong et al. |
| 6,218,280 | B1 * | 4/2001 | Kryliouk et al. .............. 438/607 |
| 6,232,196 | B1 * | 5/2001 | Raaijmakers et al. ........ 438/386 |
| 6,265,089 | B1 * | 7/2001 | Fatemi et al. ................. 428/698 |
| 6,440,823 | B1 | 8/2002 | Vaudo et al. |
| 6,488,767 | B1 | 12/2002 | Xu et al. |
| 6,533,874 | B1 | 3/2003 | Vaudo et al. |
| 6,596,079 | B1 | 7/2003 | Vaudo et al. |
| 6,765,240 | B2 | 7/2004 | Tischler et al. |
| 6,951,695 | B2 | 10/2005 | Xu et al. |
| 6,958,093 | B2 | 10/2005 | Vaudo et al. |
| 7,253,499 | B2 | 8/2007 | Shibata |
| 7,655,197 | B2 | 2/2010 | Vaudo et al. |
| 2001/0008656 | A1 | 7/2001 | Tischler et al. |
| 2001/0030329 | A1 | 10/2001 | Ueta et al. |
| 2002/0048964 | A1 | 4/2002 | Yuasa et al. |
| 2003/0213964 | A1 | 11/2003 | Flynn et al. |
| 2004/0245535 | A1 | 12/2004 | D'evelyn et al |
| 2006/0029832 | A1 | 2/2006 | Xu et al. |

FOREIGN PATENT DOCUMENTS

| | | |
|---|---|---|
| EP | 937790 A2 | 8/1999 |
| EP | 0966047 A2 | 12/1999 |
| EP | 1041610 A1 | 10/2000 |
| EP | 1065299 A2 | 3/2001 |
| EP | 1101842 A1 | 5/2001 |
| JP | 2000-22212 A | 1/2000 |
| WO | 9520695 A1 | 8/1995 |

OTHER PUBLICATIONS

Karouta, F., et al., "Final Polishing of Ga-Polar GaN Substrates Using Reactive Ion Etching ", "J. Electron. Mat.", Dec. 1999, pp. 1448-1451, vol. 28, No. 12.

Kelly, Michael K., et al., "Large Free-Standing GaN Substrates by Hydride Vapor Phase Epitaxy and Laser-Induced Liftoff ", "Jpn. J. Appl. Phys.", Mar. 1, 1999, pp. L217-L219, vol. 38, No. 3A.

Kim, S. T., et al., "Preparation and properties of free-standing HVPE grown GaN substrates", "Journal of Crystal Growth", 1998, pp. 37-42, vol. 194, Publisher: Elsevier Science B.V.

Monemar, B. et al., "Properties of VPE-GaN doped with Al and some iron group metals", "J. Applied Physics ", Oct. 1979, pp. 6480-6491, vol. 50, No. 10.

Popovici, G., "Transmutation doping of III-nitride, High-Temperature Applications—1999 Symposium", Apr. 5, 1999, pp. 519-522 (Only Abstract Available).

Stotzler, A., et al., "Identification of As, Ge, and Se photoluminescence in GaN using radioactive isotopes", "Materials Research Society Symposium Proceedings", Nov. 28, 1999, pp. w12.9.1-6, vol. 595, (Only Abstract Available).

Vaudo, et al., "Synthesis and Properties of HVPE Nitride Substrates", "IPAP Conf. Series ", 2000, pp. 15-18, Publisher: Proc. Int. Workshop on Nitride Semiconductors.

Zauner, A.R.A., et al., "Homo-epitaxial GaN growth on exact and misoriented single crystals: suppression of hillock formation ", "J. Cryst. Growth", Mar. 2000, pp. 435-443, vol. 210, No. 4.

Slack, G.A., et al., "Growth of High Purity AlN Crystals", "Journal of Crystal Growth", 1976, p. 263-279, vol. 34.

Pastrnak, J., et al., "Morphology and Growth of Single Crystal AlN", "Phys. Stat. Sol.", 1964, p. 331, vol. 7; (Only Foreign Language Version Available, English Language Summary Provided).

Schowalter, et al., "Preparation and Characterization of Single Crystal Aluminum Nitride Substrates", Dec. 1999, Materials Research Society.

Karpinski, J., et al., "Equilibrium Pressure of N2 Over GaN and High Pressure Solution Growth of GaN", "Journal of Crystal Growth", 1984, vol. 66; pp. 1-10.

Karpinski, J., et al., "High Pressure Thermodynamics of GaN", Journal of Crystal Growth, 1984, pp. 11-20, vol. 66.

Porowski, S., "Bulk and homoepitaxial Ga-N growth and characterization", "Journal of Crystal Growth", 1998, p. 153-158, vol. 189/190.

Elwell, D., et al., "Crystal Growth of Gallium Nitride", "Prog. Cryst. Growth & Charact.", 1988, pp. 53-78, vol. 17.

Wetzel, C., et al., "GaN epitaxial layers grown on 6H-SIC by the sublimation sandwich technique", "Appl. Phys. Lett." 1994, p. 1033, vol. 65.

Balkas, C.M., et al., "Growth of Bulk AlN and GaN Single Crystals by Sublimation", "Mat. Res. Soc. Proc.", 1997, p. 41, vol. 449.

Kelly, M.K., et al., "Laser-Processing for Patterned and Free-Standing Nitride Films", "Mat. Res. Soc. Symp. Proc.", 1998, p. 973, vol. 482.

Detchprohm, T., et al., "Hydride vapor phase epitaxial growth of a high quality GaN film using a ZnO buffer layer", "Appl. Phys. Lett.", 1992, p. 2688, vol. 61.

Melnik, Y., et al., "Properties of Free-Standing GaN Bulk Crystals Grown by HPVE", "Mat. Res. Soc. Symp. Proc.", 1998, p. 269, vol. 482.

Nakamura, S., et al., "High-Power Long-Lifetime InGanN/GaN/AlGaN-Based Laser Diodes Grown on Pure GaN Substrates", "Jpn. J. Appl. Phys.", 1998, p. L309, vol. 37.

Yoo, W.S., "Polytype Control in Crystal Growth of SiC for Semiconductor Devices", PhD Thesis, Apr. 1991, Kyoto University.

Iwasaki, H., et al, "4H-SiC/6H-SiC interface structures studied by high-resolution transmission electron microscopy", "Appl. Phys. Lett.", 1993, p. 2636, vol. 63.

Larkin, D.J., et al., "Site-competition epitaxy for superior silicon carbide electronics", "Appl. Phys. Lett.", 1994, p. 1659, vol. 65.

Nakamura, S., et al., "Si- and Ge-Doped GaN Films Grown with GaN Buffer Layers", "Jpn. J. Appl. Phys.", 1992, p. 2883-2888, vol. 31.

Dugger, C.O., "The synthesis of aluminum nitride single crystals", "Materials Research Bulletin", 1974, p. 331-336, vol. 9.

Porowski, S., et al., "GaN Crystals Grown in the Increased Volume High Pressure Reactors", "Mat. Res. Soc. Symp. Proc.", 1997, p. 35, vol. 449.

Logan, R.A., et al., "Heteroepitaxial Thermal Gradient Solution Growth of GaN", "J. Electrochem. Soc.", 1972, p. 1727, vol. 119.

Dryburgh, P.M., "Factors Affecting the Growth of Aluminum Nitride Layers on Sapphire by Reaction of Nitrogen With Aluminum Monoselenide," Journal of Crystal Growth, vol. 94, 1989, pp. 23-33.

Slack, G.A., et al., "AlN Single Crystals", Journal of Crystal Growth, 1977, pp. 560-563, vol. 42.

Sarney, et al., "TEM study of bulk AlN by physical vapor transport", 1999, Fall Materials Research Society, Boston, Mass, Session W5.5.

Nikolaev, et al., "AlN wafers fabricated by HVPE", 1999, Fall Materials Research Society, Boston, Mass, Session W6.5.

Sukhoveyev, et al. "GaN 20 mm diameter ingots grown from melt-solution by seeded technique", 1999, Fall Materials Research Society, Boston, Mass, Session W6.6.

* cited by examiner

III-V NITRIDE SUBSTRATE BOULE AND METHOD OF MAKING AND USING THE SAME

CROSS REFERENCE TO RELATED APPLICATIONS

This is a continuation of U.S. patent application Ser. No. 10/369,846 filed on Feb. 19, 2003 and issuing as U.S. Pat. No. 7,655,197 on Feb. 2, 2010, which is a divisional of U.S. patent application Ser. No. 09/524,062 filed on Mar. 13, 2000 and issued as U.S. Pat. No. 6,596,079 on Jul. 22, 2003. The disclosures of the foregoing applications and patents are hereby incorporated by reference herein in their respective entireties, for all purposes, and the priority of all such applications is hereby claimed under the provisions of 35 U.S.C. §120.

GOVERNMENT RIGHTS IN INVENTION

The invention was made in the performance of BMDO Contract #DNA001-95-C-0155, DARPA Contract #DAAL01-96-C-0049 and DARPA Contact #DAAL01-98-C-0071. The U.S. government has certain rights in the invention.

FIELD OF THE INVENTION

This invention relates to a III-V nitride substrate boule and method of making and using the same, as well as wafers derived from such boules, and microelectronic devices and device precursor structures fabricated on and/or in such wafers.

DESCRIPTION OF THE RELATED ART

The current lack of high quality III-V nitride substrates for subsequent deposition of nitride epitaxial layers limits the performance and slows the needed and desired development of short wavelength optoelectronic and high power, high frequency electronic devices.

For example, the current approach of heteroepitaxial growth of nitride epitaxial layers on foreign substrates, such as sapphire, is deleterious to the ultimate material quality and device functionality for the following reasons:

(1) lattice mismatch between the device layer and substrate causes a high density of performance-degrading defects in the device;

(2) thermal coefficient of expansion mismatch between the device layer and substrate introduces strain, cracking and strain-alleviating defects in the device layer;

(3) electrically insulating substrates require lateral device geometry, which can impede current flow through the device (this problem is lessened, but not eliminated for devices grown on conductive substrates such as SiC where there still exists a voltage barrier between the device layer and substrate material);

(4) large area electrical contact to p-type device layers is more difficult due to substrate-mandated lateral device geometry;

(5) heat dissipation from the device is limited by the low thermal conductivity of thermally insulating substrates, such as sapphire;

(6) the electrical characteristics of foreign substrates are not readily modifiable for specific device applications, e.g., p-doped substrates for inverted light-emitting diodes (LED) or laser diodes (LD), or semi-insulating substrates for electronic devices;

(7) the cleavability of (Al,Ga,In)N on foreign substrates is complicated by non-corresponding cleavage planes between the epitaxial film and foreign substrate; and (8) crystal orientations other than c-plane in epitaxial films or device layers are not readily achieved, as a result of which improved material and/or device characteristics for such alternative orientations are not realized.

Efforts to produce native nitride substrate boules by conventional bulk growth techniques have been hampered by several fundamental characteristics of the III-V nitrides. Foremost, the equilibrium vapor pressure of nitrogen over these compounds at moderate temperatures is extremely high. The III-V nitrides start to decompose at temperatures less than their melting temperatures, making conventional bulk growth techniques extremely difficult. In addition, the III-V nitrides have low solubility in acids, bases and other inorganic compounds. The combination of these material characteristics has made it difficult to make III-V nitride substrates.

Nonetheless, bulk growth of III-V nitride material has been attempted via sublimation and solution growth techniques (see for example G. A. Slack and T. F. McNelly, J. Cryst. Growth, 34, 263 (1974); J. O. Huml, G. S. Layne, U.S. Pat. No. 3,607,014; P. Chen, Final Report, Contract NASW-4981, (1995); and P. M. Dryburgh, The Ninth International Conf. on Cryst. Growth, ICCG-9 (1989)), as well as evaporation/reaction techniques (see J. Pastrnak and L. Roskovcova, Phys. Stat. Sol., 7, 331, (1964)). Slack and McNelly (G. A. Slack and T. F. McNelly, J. Cryst. Growth, 34, 263 (1974)) used the sublimation technique at temperatures of 2250° C. to produce small-sized AlN crystals (3 mm diameter by 10 mm long). Rojo, et al., Materials Research Society, December, 1999 ("Preparation and Characterization of Single Crystal Aluminum Nitride Substrates") reports production of 1 centimeter diameter boules of aluminum nitride, and preparation of a-face and c-face single crystal AlN substrates using chemical mechanical polishing to achieve atomically smooth surfaces, for deposition of AlN and AlGaN epitaxial layers by OMVPE. Ivantsov, et al., Materials Research Society, December, 1999 ("GaN 20 mm Diameter Ingots Grown From Melt-Solution by Seeded Technique") describes the formation of GaN ingots having a volume of 4.5 centimeters$^3$, grown from melt solution by seeded technique at temperatures of 900-1000° C., at pressures of less than 2 atmospheres, and at a growth rate of 2 mm per hour, to provide substrates for GaN homoepitaxy. Tadatomo U.S. Pat. No. 5,770,887 discloses the formation of nitride single crystal material having an XRD FWHM of 5-250 sec and thickness of at least 80 microns on oxide buffer layers, to enable etch separation of single wafers, but the resulting wafer substrates will have a limited area due to the requirement of etching laterally through the oxide buffer layer to effect separation.

The size of bulk GaN material has similarly been limited by the thermal instability of GaN at elevated temperature and limited solubility of N in Ga melts. The high equilibrium nitrogen pressure over GaN prevents it from being grown without an extremely high pressure apparatus (see J. Karpinski, J. Jum and S. Porowski, J. Cryst. Growth, 66 (1984)). The low solubility of N in Ga, namely ~$10^{-5}$ molar at 950° C., prevents the successful solution growth of GaN (W. A. Tiller, et al., Final Report, "A feasibility study on the growth of bulk GaN single crystal", Stanford U., July (1980)). Resorting to an economically unfavorable high pressure ($2 \times 10^4$ atm.) solution growth technique has yielded very small crystals less than 70 mm$^2$ in area and grown at growth rates of only 20 µm/hr.

The electrical characteristics of the bulk GaN material produced by conventional techniques are also limited by a high background carrier concentration in this material. The electron concentration of unintentionally doped GaN films grown by high-pressure solution techniques is greater than 1E19 cm$^{-3}$ (S. Porowski J. Cryst. Growth, 189/190 (1998) 153) and prevents controllable doping of this material for specific device applications.

The lack of large, high quality seed crystals for the (Al,Ga,In)N system has led to the development of unseeded growth technologies, as described above. The small amount of work on seeded GaN growth has most commonly been accomplished on sapphire (see, for example, D. Elwell and M. Elwell, Prog. Cryst. Growth and Charact., 17, 53 (1988)) or SiC (see C. Wetzel, D. Volm, B. K. Meyer, et al., Appl. Phys. Lett., 65, 1033 (1994); and C. M. Balkas, Z. Sitar, T. Zheleva, et al., Mat. Res. Soc. Proc., 449, 41 (1997)) due to the unavailability of nitride seeds. The same problems associated with lattice and TCE mismatch, which occur for heteroepitaxy of nitrides on foreign substrates, also occur for bulk growth on foreign seeds. Cracking of the nitride during bulk growth and upon cool down to room temperature eliminates the usefulness of foreign seeds. Growth rates as high as 300 μm/hr have been reported (C. Wetzel, D. Volm, B. K. Meyer, et al., Appl. Phys. Lett., 65, 1033 (1994)) for GaN crystals produced by the sandwich sublimation technique. However, the total GaN thickness produced was only 60 μm because non-nitride seeds were employed and resulted in considerable cracking.

Single wafers of GaN material have recently been produced by growing thick GaN films on foreign substrates, which were removed after growth by heating (M. K. Kelly, O. Ambacher, R. Dimitrov, H. Angerer, R. Handschuh, and M. Stutzmann, Mat. Res. Soc. Symp. Proc. 482 (1998) 973), chemical etching (wet/dry etching) of substrates and interlayer materials (T. Detchprohm, K. Hiramatsu, H. Amano, and I. Akasaki, Appl. Phys. Lett. 61 (1992) 2688; and Y. Melnik, A. Nikolaev, I. Nikitina, K. Vassilevski, V. Dimitriev, Mat. Res. Soc. Symp. Proc. 482 (1998) 269) or physical grinding of sacrificial substrates or intermediate layers (S, Nakamura, M. Senoh, S, Nagahama, N. Iwasa, T. Yamada, T. Matsushita, H. Kiyoku, Y. Sugimoto, T. Kozaki, H. Umemoto, M. Sano, and K. Chocho, Jpn. J. Appl. Phys. 37, L309 (1998)). The costs of such labor-intensive processes inhibit their widespread application in wafer fabrication.

Accordingly, it would be a major advance in the art to provide an improved III-V nitride substrate for microelectronic device manufacture.

SUMMARY OF THE INVENTION

The present invention overcomes certain problems and limitations of the prior art, by vapor phase growth of Group III-V nitride boules (ingots) on native nitride seeds.

As used herein, the term "Group III-V nitride" refers to a Group III-V compound semiconductor material including nitrogen.

The boules of the invention have a dimensional character rendering them sectionable, e.g., by sawing, slicing or other partitioning techniques, into wafer substrate sections that are sufficiently large to accommodate fabrication of microelectronic devices or microelectronic device precursor structures thereon. The boule material has crystallinity suitable for such device or device precursor structure fabrication, viz., device quality crystallinity.

In one aspect, the invention relates to a native seed crystal-grown Group III-V nitride boule having a diameter greater than 1 centimeter, and a length greater than 1 millimeter, which is substantially crack-free and has a top surface defect density of less than $10^7$ defects cm$^{-2}$.

More preferably, the diameter or transverse dimension of the boule is greater than 2.5 centimeters, and most preferably such width dimension is greater than 7.5 centimeters; the length (thickness of the boule along the growth direction) more preferably is greater than 0.5 centimeter, and most preferably is greater than 1 centimeter. The crystal quality of the boule generally is of a character yielding a double crystal x-ray rocking curve full width half maximum value of less than 600 arcseconds and more preferably less than 250 arcseconds. More preferably the top surface defect density of the boule is less than $10^6$ defects cm$^{-2}$ and most preferably the top surface defect density of the boule is less than $10^4$ defects cm$^{-2}$.

In another aspect, the invention relates to a Group III-V nitride boule, having a top surface defect density of less than $10^5$ defects cm$^{-2}$, a diameter of at least 5.0 centimeters, and a thickness of at least 1 centimeter.

A further aspect of the invention relates to expansion of single crystal area from seed crystal to the Group III-V nitride boule, involving lateral growth.

In another aspect, the invention relates to a wafer derived from a Group III-V nitride boule of the aforementioned type.

In another aspect, the invention relates to polishing a Group III-V nitride wafer to remove surface asperities and impart a desired surface smoothness to the polished wafer article.

Another aspect of the invention relates to a method of making a Group III-V nitride boule, comprising:

providing a native Group III-V nitride seed crystal for the boule; and growing a Group III-V nitride material on the seed crystal by vapor phase epitaxy at a growth rate above 20, and more preferably above 50, micrometers per hour, to yield said boule.

Although the invention preferably uses a homoepitaxial seed, foreign substrates are also contemplated within the broad scope of the present invention.

In another aspect, the Group III-V nitride crystalline material is cut and/or polished to yield a-plane, c-plane, m-plane or r-plane, etc. surfaces or slightly offcut with respect to a primary crystal plane, yielding a vicinal wafer. Both surfaces (N-terminated or group III-terminated) of the bipolar c-plane cut crystal can be polished for subsequent growth or device fabrication.

A further aspect of the invention relates to a device structure including a wafer derived from a boule of the present invention, and a microelectronic device or device precursor structure fabricated on and/or in the wafer, e.g., devices such as light emitting diodes, laser diodes, ultraviolet photodetectors, bipolar transistors, heterostructure bipolar transistors, high electron mobility transistors, high power rectifiers, wavelength division multiplexing components, etc.

In another aspect, an (Al,Ga,In)N article comprises a boule, wafer, or epitaxial layer, doped by nuclear transmutation doping to yield a room temperature electron concentration of from 1E15 to 5E19 cm-3, wherein an effective amount of Al, Ga, or In metal atoms originally present in the article have been converted to a dopant element as a result of said nuclear transmutation doping.

In a further aspect, a method comprises nuclear transmutation doping of an (Al,Ga,In)N article comprising a boule, wafer, or epitaxial layer, to convert an effective amount of Al, Ga, or In metal atoms originally present in the article to a dopant element as a result of said nuclear transmutation doping.

In another aspect, any feature(s) of the foregoing aspects may be combined for additional advantage.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
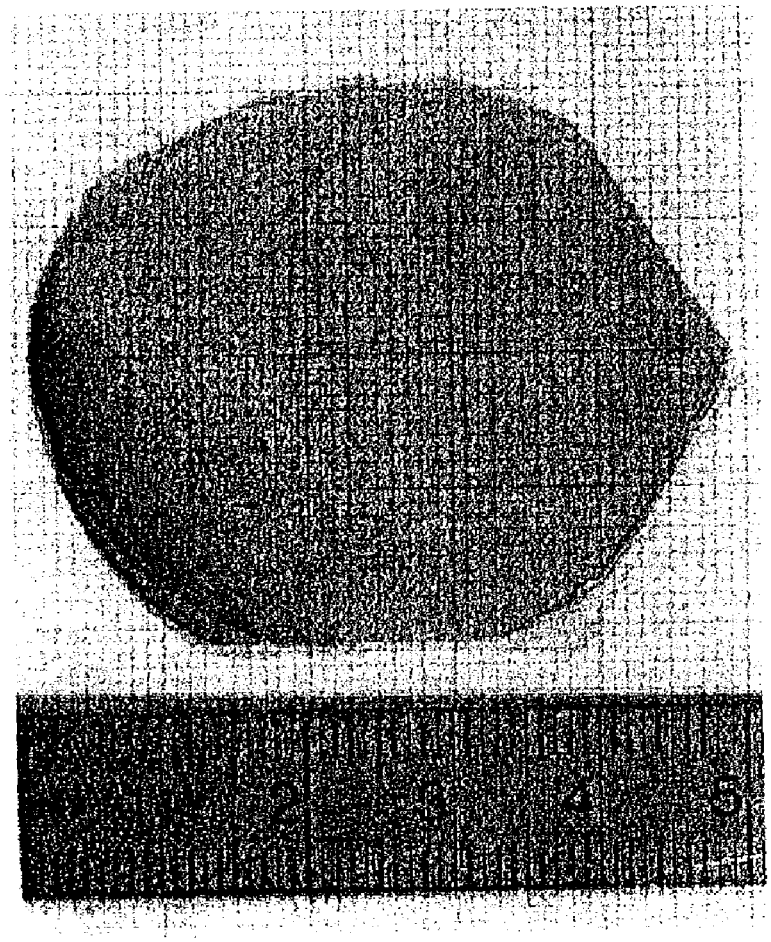
FIG. 1 is a low magnification optical photograph of a GaN seed crystal produced by HVPE and laser-induced liftoff.

The disclosures of the following U.S. patents, U.S. patent applications, and U.S. patent application publication are hereby incorporated by reference herein in their respective entireties:

U.S. patent application Ser. No. 08/188,469 filed Jan. 27, 1994 in the names of Michael A. Tischler, et al., subsequently issued as U.S. Pat. No. 5,679,152;

U.S. patent application Ser. No. 08/955,168 filed Oct. 21, 1997 in the names of Michael A. Tischler, et al., and published as U.S. Patent Application Publication No. 2001/0008656;

U.S. patent application Ser. No. 08/984,473 filed Dec. 3, 1997 in the names of Robert P. Vaudo, et al., subsequently issued as U.S. Pat. No. 6,156,581; and U.S. patent application Ser. No. 09/179,049 filed Oct. 26, 1998 in the names of Robert P. Vaudo, et al., subsequently issued as U.S. Pat. No. 6,440,823.

The present invention provides a method for producing crystalline Group III-V nitride, e.g., (Al,Ga,In)N, boules with large cross-sectional area (>1 cm in diameter) and length greater than 1 mm, on lattice-matched seeds. The deposition is carried out by high growth rate vapor phase epitaxy to eliminate the need for a cost-prohibitive high pressure apparatus. Large single crystal areas are assured through the use of large area, lattice-matched starting seeds, such as native (Al, Ga,In)N crystals. Individual wafer costs are reduced as compared to the substrate removal processes since one boule can be fabricated into multiple wafers for epitaxial growth and device fabrication.

As used in such context, the term "(Al,Ga,In)N" is intended to be broadly construed to include respective nitrides of the single species, Al, Ga, and In, as well as binary, ternary and quaternary compositions of such Group III metal species. Accordingly, the term (Al, Ga, In)N comprehends the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the ensuing discussion of GaN materials is applicable to the formation of various other (Al, Ga, In)N material species.

Various aspects of the invention are described more fully below and include growth on lattice-matched seed crystals, and boule growth by high growth rate vapor phase epitaxy (VPE).

Seeds for Boule Growth

Native nitride seeds, which are closely matched in alloy composition to the growing boule material, alleviate the strain associated with thermal coefficient of expansion (TCE) and lattice mismatch effects, and facilitate the growth of long boule material (>10 mm in axial extent) without cracking. Free-standing (Al,Ga,In)N seed crystals may be produced by any means, including, but not limited to, growing thick films on foreign substrates that are removed after growth by thermal, chemical or physical elimination of or separation from the sacrificial substrates (examples of free-standing (Al,Ga, In)N material and an associated preparation method are disclosed in pending U.S. patent application Ser. No. 09/179,049 filed Oct. 26, 1998 in the names of Robert P. Vaudo, et al. for "LOW DEFECT DENSITY (Ga, Al, In)N AND HVPE PROCESS FOR MAKING SAME" and in U.S. Pat. No. 5,679, 152).

For example, large-area GaN seeds with a dislocation density less than $10^7$ cm$^{-2}$ and an area of approximately 10 cm$^2$ are readily formable by HVPE-optical liftoff.

Since the process of the present invention produces high quality (Al,Ga,In)N boule material, individual wafers from such process can be harvested as seeds for future boule production. Continuous improvement of boule characteristics (e.g. lower defect density, lower background impurity concentration, larger area) can be perpetuated through the use of seeds obtained from successively better boule material.

To provide higher growth rate, improved boule crystallinity or improved suitability for epitaxial growth and devices, the seed may be oriented along any number of directions, including, but not limited to, c-axis, a-axis, m-axis or r-axis. In addition, the seed may be offcut up to 10 degrees from a primary crystal axis. It may be beneficial to direct the offcut in a particular direction, e.g. an offcut of 5 degrees from the (0001) plane may be directed towards the <1$\bar{1}$00> or the <11$\bar{2}$0> directions. In addition, both sides (N-terminated or group III-terminated face) of c-axis oriented seeds may be employed for boule growth, epitaxial growth, device fabrication or device performance advantage.

Although less desirable, foreign seeds of materials such as sapphire or silicon carbide may also be employed for the process of the instant invention. Thermal expansion mismatch- or lattice mismatch-induced strain and cracking may be relaxed in the seed, rather than in the boule, due to the comparatively larger thickness of the boule material.

In addition, compliant and other means may be used to mitigate the differences in thermal and lattice match between the base seed and the growing boule. Alternatively, in situ parting or removal of foreign seeds may be employed to eliminate complications from the use of thermal expansion mismatch.

In addition, interlayers between the seed and the boule material may be employed to alleviate strain, alter the electrical characteristics, reduce defect density, permit separation from the seed, or facilitate growth nucleation. Such interlayers could be deposited by various techniques, such as for example vapor phase epitaxy (VPE), chemical vapor deposition (CVD), physical vapor deposition (PVD), molecular beam epitaxy (MBE), metalorganic vapor phase epitaxy (MOVPE), or hydride vapor phase epitaxy (HVPE). Such interlayers may be formed of any suitable materials, including, without limitation, (Al,Ga,In)N or other Group III-V nitride, SiC, SiN (being one preferred interlayer material for reducing defect density of the boule) and oxides. Patterned interlayers may also be used to facilitate defect density reduction and strain reduction, as for example with lateral epitaxial overgrowth techniques. Interlayers may be formed by chemical reaction, ion bombardment, reactive ion etching or other modification of the seed crystal. Such interlayers may be uniform across the seed or may be patterned to favorably impact the growth nucleation, boule separation or boule material improvements. The advantages of patterned interlayers are more fully described in U.S. Pat. No. 5,006,914, Beetz, Jr. and U.S. Pat. No. 5,030,583, Beetz, Jr.

In one aspect of the invention, defect density of the boule product is advantageously minimized by thick boule growth and use of suitable seed crystals, e.g., seeds with either suitably low defect density in the first instance, or which are patterned or otherwise treated to facilitate defect annihilation during boule growth. The invention contemplates the use of seeds patterned with etched regions or coated regions that prevent growth on specific regions of the seed and promote lateral growth, in order to reduce defect density. The invention also contemplates the use of compliant seed crystals that serve to accommodate lattice-mismatch or thermal coefficient of expansion-mismatch between seed material and boule material for such purpose. Using optimized seed crystals and optimally thick boule growth, it is possible to achieve very low defect levels in the product boule material. Since single crystal (Al,Ga,In)N seeds obtained from (Al,Ga,In)N boules may be advantageously used for subsequent boule growth. Material characteristics, including for example defect density reduction, impurity concentration and area expansion, may be progressively improved during boule growth, leading to better device quality material with subsequent boule growth and progressively improved seed crystals obtained from said boule material.

In one aspect of the invention, seed crystals are formed for boule manufacturing method by growing a thick (Al,Ga,In)N starter layer on a dissimilar substrate and removing the dissimilar substrate by physical, thermal or chemical means. One such native seed formation technique uses optical liftoff to remove the dissimilar substrate.

Optical liftoff separation of the (Al,Ga,In)N film from a dissimilar substrate is accomplished by interface decomposition induced by photonic energy. For example, using a GaN seed crystal as an example, the GaN seeds may be grown on sapphire wafers and then separated or "lifted-off" the sapphire by laser-induced heating of a thin region of GaN at the GaN/sapphire interface to produce free-standing GaN. The 355 nm wavelength light of a Q-switched Nd:YAG laser may be transmitted through the sapphire for such purpose. Since the photon energy is slightly above the GaN bandgap, the incident radiation is absorbed in a thin layer (70 nm) of the GaN. Sufficient absorbed light (e.g., greater than about 0.3 Joules/cm$^2$ for GaN) induces thermal decomposition of the thin interfacial layer and separation of the GaN from the sapphire. To achieve sufficient light energy, a beam much smaller than the seed area may be employed and the beam may be sequentially scanned to produce larger area freestanding GaN material.

Separation from the dissimilar substrate by optical liftoff may also be accomplished in situ to the growth process, with the (Al,Ga,In)N material being held at a temperature near the growth temperature to reduce strain due to differences in the thermal coefficient of expansion between the (Al,Ga,In)N material and the dissimilar substrate. Alternatively, the entire seed wafer can be separated at one time or in one pulse with a sufficiently higher power radiation source.

The structural characteristics of such seed crystals are very important to the ultimate quality of the III-V nitride boule grown on them. To verify the suitability of the seed crystal for use in a specific application, plan-view transmission electron microscopy (TEM) may be employed to determine the typical defect density of the top surface of the seeds. For GaN, for example, such seed crystal top surface defect density is desirably less than $10^7$ cm$^{-2}$, which compares favorably to the defect density observed in large area GaN epitaxy.

Boule Growth

The deposition of (Al,Ga,In)N in accordance with the present invention for boule growth is advantageously carried out by a high growth rate vapor phase epitaxy (VPE) technique. Since growth in the vapor phase proceeds further from equilibrium than in conventional bulk growth techniques and large amounts of N-reactant can be supplied compared to Group III elements, the need for a high pressure apparatus is eliminated.

Boule growth in accordance with the present invention is advantageously carried out under specific process conditions to achieve Group III-V nitride substrate boules of superior character.

To obtain desired high throughput with acceptable overall processing duration, growth rates in excess of 50 μm/hr are advantageously employed, with growth rates in excess of 200 μm/hr being preferred, and growth rates in excess of 500 μm/hr being most preferred. Growth is beneficially carried out at temperatures between about 900 and about 1100° C. for GaN, between about 950 and about 1200° C. for AlN, and between about 700 and about 900° C. for InN, with adjustments between these temperatures being necessary for alloy growth, as is readily determinable within the skill of the art by straightforward empirical determination.

Precursors for the VPE process may include, but are not limited to hydride, chloride or metal-organic precursors. NH$_3$ or other N-containing precursors, e.g., hydrazine, amines, polyamines, etc., may be employed to provide the Group V species. The alloy composition in the boule is readily controlled by the individual flow of Group III precursors. The flow of the N-containing precursor is preferably maintained at a considerably larger flow rate than the Group III precursor flow rate (e.g., NH$_3$/Group III flow ratios of 10 to 1000 are common and are dependent on the fraction of NH$_3$ decomposition).

The respective precursors when introduced to the growth reactor should have sufficient residence time in the reactor to permit their adequate mixing. Mixing times of N and group III precursors should generally be less than about 20 microsecond to minimize extraneous gas-phase reactions.

As an alternative, the Group III precursor(s) may be mixed with the nitrogen precursor to form a stable liquid composition at ambient conditions, which then is delivered to the growth reactor using a liquid delivery system, as for example of the type disclosed in Kirlin et al. U.S. Pat. Nos. 5,204,314 and 5,536,323. In such liquid delivery process, the solution is vaporized to form precursor vapors that are transported to the growth reactor for carrying out epitaxial growth. Typical Group V precursors include amines, polyamines, hydrazine, etc., and typical Group III precursors include halides, hydrides, metalorganics, etc. Several Group III precursors may be mixed in one solution to produce a binary or ternary nitride boule, and dopant precursors may also be mixed in the solution to produce n- or p-type doped boules.

Defect density of the boule product is advantageously minimized by thick boule growth and use of suitable seed crystals, e.g., seeds with either suitably low defect density as initially provided, or which are patterned or otherwise treated to facilitate defect annihilation during boule growth. Alternatively, compliant seed crystals that act to accommodate lattice-mismatch or thermal coefficient of expansion-mismatch between seed material and boule material are also beneficial for this purpose. Using optimized seed crystals and optimally thick boule growth, very low defect levels in the product boule material, e.g., defect densities less than $10^4$ cm$^{-2}$ are achievable in the practice of the present invention.

Single crystal GaN seeds obtained from GaN boules may be advantageously used for subsequent GaN boule growth. The defect density is progressively reduced during boule growth, leading to better device quality material with subsequent growth.

Large area wafers are of more commercial interest than smaller wafers because more devices can be produced on larger wafers. It is advantageous to produce large area wafers, but the initial seed, e.g., of GaN, may have limited size. For growth of GaN on such seed, the GaN boule growth condition can be adjusted, such as for example by use of higher growth temperature, higher NH3/Ga ratios, lower pressures, desirable thermal gradients and non-uniform flow patterns, so that single crystal GaN is grown both in the direction perpendicular to the seed and in the direction parallel to the seed. The edges of the seeds should be bare single crystal facets to facilitate replication in the lateral direction. In such manner, the single crystal area of the GaN boule will become larger as the boule grows. The large single crystal area GaN wafer can again be used as seed to produce even larger boules. With each subsequent growth, the single crystal area of the GaN can correspondingly be further expanded. Additionally, exposure of lateral growth surfaces or crystal planes can accelerate the lateral growth rate and accelerate the lateral expansion of the boule.

To prevent encroachment of the single crystal area, care is taken to minimize spurious polycrystalline growth at the seed edges. Providing bare crystal facets to enable lateral growth of high quality material will prevent waning of the single crystal area. Alternately, the edges of the crystal can be coated with a growth inhibiting material (e.g., $SiO_2$ or $Si_3N_4$ for GaN) to minimize growth of any kind at the edges.

Additionally, impurities (surfactants) can be used at the start of or during growth to control the formation of the crystal. Surfactants may be employed to control the structure (e.g., cubic or hexagonal), growth uniformity and/or dopant incorporation. In compound semiconductors, the stacking order of the atoms (how the atoms are placed relative to one another while atom ratio is unchanged) can vary, which in turn affects the physical, electrical and optical properties of the resulting crystal. For example, in SiC, over 200 different stacking arrangements, or polytypes, have been identified; the most common are 4H, 6H, 15R and 3C. In GaN, cubic, hexagonal (2H) and rhombohedral (9R) (see, for example, (H. Selke et al., J. Cryst. Growth, 208, 57 (2000)) polytypes have been produced to date.

The polytype produced can be controlled, in part, by adjusting the growth temperature (Matsunami, W. S. Yoo, PhD Thesis, April 1991, Kyoto University), the pressure, the seed or substrate orientation (e.g. vicinal surfaces as a template) and through the presence or absence of selected impurities (H. Iwasaki et al., Appl. Phys. Lett. 63, 2636 (1993)). The impurities may act to alter the surface structure or chemistry by binding preferentially to certain sites on a planar or stepped surface and consequently altering the stacking structure. Alternatively, or additionally, the impurities may alter the bulk properties of the crystal (effecting small modifications of the lattice constant or the electronic structure) which in turn affects the subsequent stacking of layers. The presence of certain impurities, or the fractions of growth constituents present, may also alter dopant incorporation (site competition epitaxy) (D. J. Larkin, P. G. Neudeck, J. A. Powell, and L. G. Matus, Appl. Phys. Lett. 65, 1659 (1994)) or crystal quality (S, Nakamura, T. Mukai, M. Senoh, Jpn. J. Appl. Phys. 31, 2885 (1992)).

The seed crystals are carefully prepared to enable replication of crystal structure and minimize introduction of new defects during boule growth. The seed crystals are advantageously polished and etched to remove surface defects, and thoroughly cleaned to remove any contaminants prior to boule growth.

In general, the process conditions may be readily empirically determined by variation of a specific process condition with boule material characterization as feedback. Some of the important material characteristics which may be optimized include defect density, surface morphology, crystallinity, electrical and optical properties, as well as damage caused in material handling and wafer fabrication. The defect density can be characterized by TEM correlation with decoration etching (hot sulfuric/hot phosphoric acids) and/or atomic force microscope (AFM) measurements. Surface condition can be assessed with AFM, SEM, Nomarski optical microscope, AES, LEED, Kelvin probe, EDS or other suitable analytical techniques and devices. Crystallinity can be assessed by double crystal x-ray diffraction, quadruple crystal x-ray diffraction, and optical examination through cross-polarizers. Electrical properties are characterizable by Hall effect and capacitance-voltage determinations. Optical characteristics by room temperature and low temperature PL determinations. Boule orientation can be characterized by Laue diffraction. Seed or boule polarity is readily determinable by etching techniques, AES, LEED and EDS techniques. Subsurface damage can be assayed by etching and/or MOCVD overgrowth techniques.

During the growth process, the growth vessel should minimize mixing time of Group III precursors with Group V precursors while still providing homogeneous mixture of the individual precursors and dopants. A concentric inlet flow design for the inlet of the growth chamber and/or use of a rotating seed crystal may be employed to facilitate gas mixing. The growth vessel is desirably constructed and arranged to enable replenishment of the source materials so that the length of the boule is not limited by supply of reactants. Similarly, appropriate disposition and handling of process byproducts with high throughput filtration is desired so that the process is not stopped or undesirably altered by overpressuring the growth vessel.

The hydride vapor phase epitaxy (HVPE) technique affords a highly effective method of growing III-V nitride boules on native seed crystals since it provides a high growth rate, uses low-cost, replenishable precursors and is a proven manufacturing technique for arsenide and phosphide semiconductors.

In the HVPE process, using GaN as an example, HCl is passed over a source of high purity gallium (Ga), volatile GaCl is formed and transported to the deposition zone where it reacts with ammonia ($NH_3$) to form GaN. The entire process, including formation of the GaCl, decomposition of the $NH_3$ and GaN formation, may be advantageously carried out in a hot-walled reactor.

Large growth rates are desirable for economical deposition of long boules. By HVPE, it is desirable to maximize the surface area of the gallium metal, as the supply of the gallium chloride (or other Group III sources for VPE) and its formation limits the growth rate in the process. Growth rates larger than 0.15 mm/hr may be employed, which is considerably larger than those achieved by MOVPE, MBE or high pressure solution growth of GaN. Such a large growth rate is also facilitated by the efficient decomposition of $NH_3$ in the reactor hot zone and the favorable reaction between $NH_3$ and GaCl at the growth temperature.

Several aspects of the growth process may also be controlled to achieve the desired boule quality and morphology. The distance between the source gas inlets and the growing surface impacts the crystal quality and may be adjusted as required to obtain the desired result. It is desirable to maintain this distance between the inlets and the growth surface constant throughout the growth process, to ensure uniform gas mixing, while minimizing pre-reactions and maintaining constant temperature.

Thus, for example, the boule may be fixtured and during the growth process the boule may be retracted by a suitable carriage, motion stage, fixture gearing arrangement or other suitable structure, to maintain the aforementioned distance between the growth surface and the precursor vapor source at a constant or otherwise appropriate value during the growth of the boule, to "isothermalize" the growth process, i.e., make the growth process as isothermal as possible, and thereby achieve high quality and isotropic characteristics in the product boule and wafers made therefrom.

The temperature profile may alternatively be varied during the growth process to compensate for the increasing bulk of the boule and the resultant axial temperature differentials.

Additionally, the temperature may be varied as to its general level to maximize product quality. For instance, the (Al, Ga,In)N films generally have a lower background carrier concentration when grown at higher temperatures. However, cracking resulting from residual strain between a non-native seed and growing crystal is minimized by the use of lower seed temperatures. Higher temperatures, however, enhance lateral growth and may be employed to expand the boule crystal area. Thus, growth may be initiated at a lower temperature, with the temperature being subsequently increased to grow higher purity material and expand crystal area, if cracking at such higher temperature is not a problem. In general, the temperature can be modified throughout the boule growth process to impact the properties of the growing film.

The cleanliness of the reactor and growth reproducibility in the growth process is vital to the boule growth process and is desirably maintained by periodic in situ etching (etch-cleaning) of the reactor components. Such a cleaning step can be accomplished by flowing HCl or other cleaning reagent in the reactor at or near the growth temperature. Alternatively, or in addition to the periodic etching, a small amount of HCl or other cleaning reagent may be utilized during the growth cycle to minimize buildup of solids and deposits on the reactor components. The cleaning agents may be directed at the reactor walls to facilitate or enhance removal of deposits. Such cleaning procedures also significantly extend the usable lifetime of the growth system apparatus. As a further approach, reactor liners can be used and replaced to improve reactor cleanliness and/or usable lifetime.

Conductivity Control

Conductivity of the (Al,Ga,In)N material can be controlled by adding n-type, p-type and/or deep level impurities into the gas phase in the growth process. Addition of n-type impurities such as silicon or germanium, e.g., using silane or germane in the growth process gas stream, can be used to control the n-type conductivity of the material. Correspondingly, the addition and activation of p-type impurities such as beryllium, magnesium or zinc, using metalorganic or other sources of these elements delivered to the process gas stream, can be used to control the p-type conductivity of the boule material and wafers produced from the boule. Donor and acceptor concentrations ranging from 1E15 to 1E20 $cm^{-3}$ are preferred, and concentrations ranging from 5E17 to 1E19 $cm^{-3}$ are more preferred, in the practice of this method.

The fabrication of p-type (Al, Ga, In)N boule material and wafers will favorably impact bipolar devices (e.g., light emitting devices, such as LEDs and laser diodes). Performance of and currents through such devices is limited in large part by high resistance electrical contact to the p-layer of the device. The use of p-type substrates enables the formation of significantly larger (10×) p-electrodes and a corresponding reduction in p-contact resistance. Operating temperature and functionality of (Al,Ga,In)N laser diodes on p-(Al,Ga,In)N wafers with larger p-contact area is usefully employed to greatly improve the achievable power output and increase the usable lifetime of these devices.

Semi-insulating character may be provided in the boule by establishing a balance between residual shallow acceptors (or donors) and the intentional deep level donors (or acceptors). For instances where similar concentrations of n-type and p-type impurities are present, it may be necessary to introduce a small amount of shallow acceptors (donors) to fix the conductivity type which is being compensated for by the deep level donor (acceptor). The achievement of semi-insulating substrates requires low background impurity concentration. Background impurity concentration in the boule material may be minimized by using Si- and O-free reactor materials or liners (e.g., AlN coated components) and use of high purity source materials ($NH_3$ is a known source of oxygen impurity). Since a dramatic background impurity reduction is observed with distance from the seed interface, long boule growth favors background impurity reduction.

Deep level impurities are usefully incorporated into the III-V nitride boule material during substrate growth to compensate for residual electrically active impurities. The concentration of deep acceptor and/or donor levels is desirably precisely controlled to fully compensate the residual or low concentration intentional shallow impurities in the material. This compensation produces high resistivity material with a Fermi level that resides near the center of the band gap. The levels must also be deep in the bandgap so as to prevent subsequent thermal ionization of the carriers, particularly for high temperature/high power devices. Many transition metals, including Fe, Cr and V may be useful species for deep level dopants in GaN and other III-V nitride materials, creating deep electronic states in the bandgap. Other deep level dopant species that may be usefully employed include As, Mn, Co, Ni and Cu.

In addition, conductivity of the boule may be changed after the growth has been completed.

One such technique for altering the conductivity of the boule involves nuclear transmutation doping, by which improved dopant uniformity and/or increased electrically active dopant concentrations may be achieved. Although discussed below in reference to GaN, it will be understood that the technique may be correspondingly applied to other Group III-V materials within the scope of the present invention.

Nuclear transmutation doping of the GaN material is accomplished by irradiating it with thermal neutrons. Captured neutrons create radioactive isotopes of the Ga and N atoms in the crystal, which upon decay, are converted to dopant impurities in the GaN crystal. In the silicon industry, nuclear transmutation doping has been utilized to achieve phosphorus doping of silicon with exceedingly uniform dopant distribution, but such technique has not previously been applied to nitride compound semiconductor materials such as GaN and related alloys. In application to Group III-V nitride materials, there are several anticipated advantages of nuclear transmutation doping, including:

(1) the ability to achieve electrically active doping concentrations in excess of what can be achieved by dopant incorporation during growth, since doping concentrations are not limited by solid solubility of the impurity in the material;

(2) the use of nuclear transmutation doping is markedly more efficient, e.g., ~10 times more efficient, than conventional Si doping, and problems associated with other, confounding reactions typical of alloy semiconductors in conventional doping are minimal in nuclear transmutation doping;

(3) in Ge doping by nuclear transmutation doping, the Ge dopant will reside only on the Ga site and the Ge dopant is unlikely to bind with other species present in the gas stream, thereby increasing doping efficiency (with a single activation energy) and obviating the need for activation through techniques such as annealing;

(4) the dopant will be distributed highly uniformly and the entire boule may be doped simultaneously;

(5) nuclear transmutation doping of GaN grown with isotopically pure $_{31}^{71}$Ga to increase the neutron capture efficiency, making the irradiation doping process less costly with potentially increased thermal conductivity; and (6) nuclear transmutation doping may be used to dope the boule, as well as individual wafers (produced by any method) and epitaxial films.

As an example of the utility of transmutation doping, considering the effect of thermal neutrons on Ga. The following reactions occur:

From these reactions it is seen that exposure of GaN to thermal neutrons may produce one of two isotopes of Ge with high efficiency. The half-life of the unstable isotope produced is reasonably short. The Ge will reside on the Ga site. Because the dopant is not produced during growth, there is a reduced likelihood that the dopant will be compensated by H, for example, thereby eliminating the need for an additional annealing step.

On the other hand, the effect of thermal neutrons on N may not be significant. $^{14}$N is 99.63% of the naturally abundant N. The low neutron capture cross section, the high natural abundance of $^{14}$N, and the stability of $^{15}$N, minimize the likelihood of any significant change in electrical properties with neutron transmutation.

The production of a Ge n-type impurity on a Ga site in this manner achieves a highly uniform doping and avoids detrimental effects of high concentrations of impurities in the reactor during growth. Embrittlement that may otherwise arise from high doping concentrations in the use of other doping techniques will also be reduced in nuclear transmutation doping.

Neutron irradiated GaN will yield the following isotopes: $_7^{16}$N, $_{31}^{70}$Ga, and $_{31}^{72}$Ga. These isotopes will decay in turn to isotopes with half lives of 2.31 min, 21 min and 14.1 hours. The capture cross-section for nitrogen by the neutrons is nearly an order of magnitude less than that for Ga, but nevertheless, an oxygen dopant can be produced in addition to Ge.

The radioactivity produced following irradiation at the level sufficient to produce $1 \times 10^{19}$ Ge atoms in a cubic centimeter of GaN is initially high (>$10^5$ Currie), but because of the short half lives the activity will be reduced to a few microcuries after 10 days.

The nuclear transmutation doping technique may also be applied to other materials where cracking is prone to occur or high doping levels are otherwise difficult to achieve, such as silicon carbide.

Alternatively, diffusion of n-type, p-type or deep level impurities at elevated temperatures may also be used to achieve desired conductivity levels.

Wafer Fabrication

Boules grown in accordance with the present invention may have any suitable dimensional character appropriate to the end use of the product wafers derived from the boule. For example, the boule may have a cross-sectional (lateral) area of 5-10 square centimeters or higher, and may be 4-5 millimeters long or even longer. The boule should have sufficient length to enable slicing or other partition of the material into individual wafers (e.g., of 0.1 to 0.7 millimeters thickness).

Once the boule has been grown, the boule may be oriented using conventional Laue or θ-2θ x-ray diffraction processes. The boule may be sliced (wafered) using any suitable slicing tool, such as for example an ID or OD saw, and most preferably a wire saw. The wafers may be oriented along a principal crystallographic direction or may be slightly (less than 10

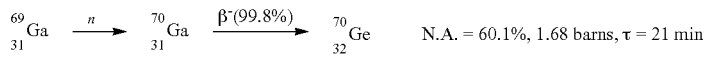
N.A. = 60.1%, 1.68 barns, τ = 21 min

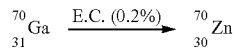

N.A. = 39.9%, 4.7 barns, τ = 14.1 hrs degrees) misoriented to provide a stepped surface for subsequent epitaxial growth or boule growth. Specific crystallographic orientations may be preferred for subsequent epitaxial growth in consequence of their benefit to epitaxial crystal quality, epitaxial surface morphology, unintentional dopant exclusion, dopant incorporation and dopant activation properties, electrical and/or optical properties, cleavability, increased carrier mobility or other device fabrication or performance advantages. The boule may be sized and flatted prior to slicing, or sized and flatted as individual wafers. The sizing and flatting may be accomplished with conventional grinding (boule) or with particle bombardment or abrasion, single wiresaw cutting, core drilling, or laser cutting (wafer).

The wafers may be edge ground. After formation of wafer blanks, the wafers are polished to a desired surface quality for epitaxial growth of GaN or other epitaxial growth material. Wafer polishing is accomplished with progressively diminishing sizes of abrasives. For example, the wafer is first lapped with a coarse abrasive (e.g., 10-30 microns diameter of abrasive particles), followed by lapping with a medium abrasive (e.g., 3-10 microns particle diameter). The wafer is then polished with a fine abrasive (e.g., 0.1-3 microns particle diameter). One or more lapping and/or polishing steps may be used. Abrasives such as alumina, silicon carbide (SiC), boron carbide, diamond and other materials harder than the GaN (or other Group III-V nitride involved) may be used. The wafer may be subjected to a chemical mechanical polish (CMP) to remove surface damages caused by mechanical polishing. The CMP process may be performed in a basic slurry (pH>8) or in an acidic solution (pH<6). An oxidation agent may be added in the slurry to increase the CMP rate. Colloidal silica or alumina may be used for GaN CMP. Alternatively, after mechanical polishing, reactive ion etch, electromechanical etch, or photoelectrochemical etch may be used to finish the wafer and remove surface damage.

The GaN wafer may be single side polished, or polished on both sides (double side polished), as necessary for a given subsequent use of the wafer. The wafer may be subjected to chemical etching either prior to the lapping step or prior to the polish step. The etchant may be of any appropriate type, such as a hot acid or hot base.

In general, as-polished GaN wafers may have subsurface damage caused by the mechanical action of the polishing particles. The subsurface damage may introduce defects in the subsequent epitaxial growth of the Group III nitride films. There are several ways to characterize the subsurface damage. Examples include epitaxial growth to reveal the subsurface damage, etching to reveal the subsurface defects, x-ray topography to image the subsurface damage, transmission electron microscopy (TEM) and ultraviolet (UV) photon backscattering spectroscopy to map the damage. X-ray topography and UV photon backscattering spectroscopy are non-destructive and may be used for defect characterization. In UV photon backscattering spectroscopy, defects in the GaN wafers have different light scattering characteristics, and thus can be used for characterization. Epitaxial growth is the most direct method to characterize the polish damage, but it is destructive to the wafer. Some etching methods, also destructive when used to decorate defects, such as chemical etching, electrochemical etching, photoelectrical chemical etching, reactive ion etching (RIE), high temperature annealing, or annealing in a reactive atmosphere, may also reveal the polish damage.

The foregoing methods of characterization may be employed to determine the nature and extent of subsurface damage of the wafer, as an adjunct to use of methods for removing or minimizing subsurface damage, e.g., by chemical etch, CMP, thermal etch or RIE (in a Cl-based or a Cl—F chemistry).

In preferred practice, it is desired to impart the wafer with a smooth surface finish with a root mean square (RMS) roughness less than 5 Angstroms over a 10×10 micrometer$^2$ area, as measured by an atomic force microscope. The wafer desirably has a radius of curvature that is greater than 1 meter. Grinding may be used to produce flats, but may be difficult to orient with high precision. The wafer may have a flat oriented to better than ±0.3 degrees. Such a precise flat may alternately be produced by cleaving.

Desirably the wafer is of sufficient quality to act as the foundation of an LED device in LED applications. In laser diode applications, the wafer is desirably of sufficient quality to function as the foundation of a laser diode device that lases at room temperature. In HEMT applications, the wafer should be of sufficient quality to act as the foundation of an HEMT device.

Concerning the utility of a wafer as a substrate article for fabrication of microelectronic device structures, the wafer's usefulness is determined in part by its physical shape. In particular, if the wafer is bowed, if the thickness of the wafer varies, or if the wafer is warped, the ability to lithographically pattern fine features using optical lithography may be inhibited or even destroyed. Additionally, the ability to achieve growth of high quality epitaxial films on the wafer may be compromised since the fraction of wafer in contact with the susceptor surface changes and consequently, the heating is nonuniform. For Group III-V nitride substrates such as GaN substrates to be useful and commercially viable, the following limitations on the wafer structure are desirable:

- the bow of the wafer should be less than 1 m (radius of curvature) and more preferably less than 4 m;
- the total thickness variation (TTV) should be less than 20% of the average wafer thickness and more preferably less than 5%; and
- warp (measured as the difference between the high point and low point on a given surface) should be less than 50 microns and more preferably less than 10 microns.

Application of the foregoing criteria to the production of wafer articles from the boule of the invention will ensure that the wafer is appropriate for subsequent microelectronic device fabrication on or in the wafer.

Specific Embodiment of the (Al,Ga,In)N Boule Process

The method of the present invention permits crystalline (Al,Ga,In)N boules to be produced by high growth rate vapor phase epitaxy, having large cross-sectional area (e.g., >1 centimeter in diameter) with a length>1 millimeter on lattice-matched seeds. The growth rate may for example be above 20 micrometers per hour, at a temperature of from about 900 to about 1200° C., with preferred temperature for GaN being in the range of from about 900 to about 1100° C., and with preferred temperature for AlN being in the range of from about 950 to about 1200° C.

In one specific illustrative embodiment, GaN boules were grown on GaN seed crystals. One such seed is shown in FIG. 1. This seed was produced by growing 300 μm of GaN by hydride vapor phase epitaxy (HVPE) on sapphire and subsequently lifting the GaN off the sapphire by laser-heating a thin region of GaN at the GaN/sapphire interface. The GaN seed was transparent and provided a strain-relaxed seed for subsequent GaN boule growth.

Figure 2:
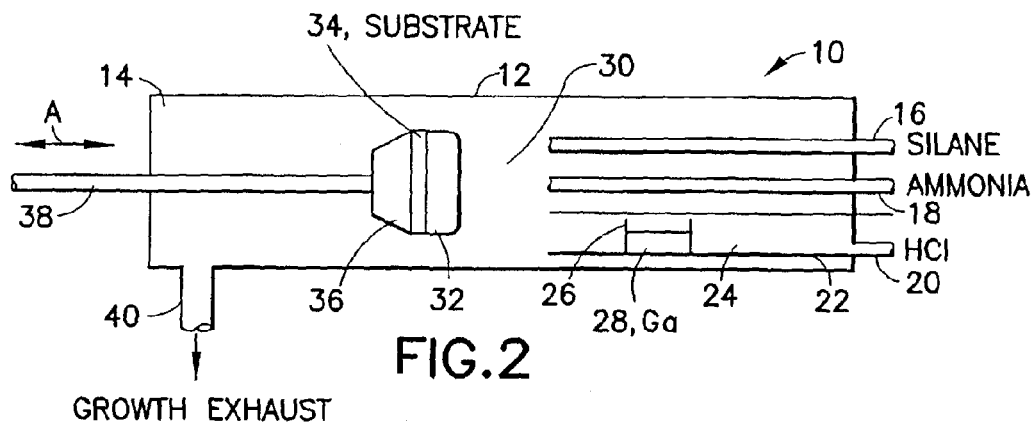
FIG. 2 is a schematic representation of a GaN HVPE system for producing a boule according to one embodiment of the invention.

Subsequent boule growth can be readily accomplished by hydride vapor phase epitaxy (HVPE) in a reactor system of a type as shown schematically in FIG. 2.

Referring now to FIG. 2, there is shown a schematic representation of a reactor system 10 including a reactor vessel 12 defining an interior volume 14 therein. While the FIG. 2 system is shown in the conformation and orientation illustrated in the drawing for purposes of illustration, it will be appreciated that the reactor in some embodiments of the invention is advantageously conFIG.d as a vertical reactor system. Joined in gas supply relationship to the reactor vessel 12 are feed line 16 for silane, feed line 18 for ammonia and feed line 20 for hydrogen chloride (HCl). Each of these reagent feed lines 16, 18 and 20 are joined to suitable source vessels or other supplies (not shown) for the respective reagent gases. The HCl feed line 20 communicates with an interior compartment 22 of the reactor vessel 12 bounding a restricted volume 24 of the reactor interior volume. The restricted volume 24 contains a vessel 26 holding molten gallium 28.

The interior volume 14 of the reactor vessel 12 also contains a retractable susceptor 36 mounted on shaft 38 which in turn is joined to a motive driver (not shown) such as an electric motor, a rack and pinion gear structure, a piston, motion stage assembly, carriage, or other motive structure for selective translation of the shaft 38 in either of the directions indicated by the bi-directional arrow A. Uniformity of the growth temperature and reactant species is also improved in a preferred embodiment of the invention by rotation of the shaft 38 during growth.

The system shown in FIG. 2 may be modified from the arrangement shown. For example, the system may include provision for metal replacement via a pumped vessel that is heated to flow the metal in liquid form to the growth chamber. The conformation of the system, as discussed above, may be vertical, and the system may variously include means for introducing HCl for cleaning of the growth chamber, a liner in the growth chamber, and/or a filter/bubbler arrangement for supply of alternate reactants.

On the end of the shaft is mounted a susceptor 36, which may be suitably heated, e.g., by the surrounding furnace, and/or by an embedded electrical resistance heating element, incident infrared radiation, incident microwave radiation, or in other manner (heater not shown). It will be appreciated that more than the susceptor is typically heated, e.g., with a hot wall reactor in which the entire growth zone and the Ga metal zone are enclosed in a resistance-heated furnace. On the susceptor is mounted a seed crystal 34 on which is grown the boule 32. The boule is grown from the precursor vapor which is mixed from the feed lines 16 (silane), 18 (ammonia) and the interior compartment 22 (gallium chloride, produced by reaction in the compartment of gallium with HCl), in the vapor space 30 of the interior volume 14 of the reactor vessel 12.

In the vapor space, the respective precursors combine and gallium nitride (GaN) is formed on the growth surface of the seed crystal at the inception of operation, followed by propagation of the deposition growth in the axial direction of the elongate reactor vessel.

As the boule 32 grows, the shaft and associated retractable susceptor may be translated for incremental withdrawal of the shaft and susceptor assembly from the reactor vessel 12. The consequence of such movement is to move the growth surface away from the outlets of the feed lines 16 and 18 and the outlet of interior compartment 22, and such movement may be modulated during the growth process to maintain the distance between the growth surface of the boule and the outlets of the precursor feed passages at a constant value, so that the boule growth surface is thereby isothermalized as it grows and the mixing time of the source materials is maintained constant as the boule grows. Additionally, or alternatively, the temperature in the reactor vessel may be modulated to achieve a desired character of the boule article produced in the reactor vessel.

The HVPE boule growth process exploits an inherent defect annihilation mechanism that is maximized by HVPE growth under proper growth conditions, involving a steady decrease in defect density with HVPE material thickness (more fully disclosed in U.S. patent application Ser. No. 09/179,049 filed Oct. 26, 1998 in the names of Robert P. Vaudo, et al.). For example, using GaN as an illustration, the dislocations in the HVPE GaN material continue to be tilted with respect to the growth direction and each other as the films grow. Dislocation density levels of less than $5 \times 10^6$ $cm^{-2}$ have been reproducibly achieved on 200 to 300 µm thick GaN layers on sapphire, and such defect levels are readily achievable in the practice of the present invention, as well as lower defect densities, e.g., less than $10^4$ $cm^{-2}$. Because the dislocations are still tilted after hundreds of microns of growth, dislocation annihilation of tilted dislocations will continue throughout the boule as it grows. Of course, the ability to sustain the dislocation annihilation will depend on the character of the remaining dislocations. Such ability can be assisted by (i) growing longer boules and (ii) using seeds which are generated farther down the boule process (i.e., using a seed sliced from a boule after defect density reduction has occurred).

Since the reactants to the HVPE process can either be loaded in large quantity (such as Ga), be replenished periodically during growth, or be continually supplied (such as HCl, $NH_3$), the process is amenable to growing very long boules. Boule growth on "native" seeds (of the same III-V nitride) is critical to making very long boules since cracking due to mismatch strain will be eliminated. Concerning the importance of growing on TCE-matched seeds, if boule growth is carried out on a seed that has a different TCE than the III-V nitride being grown, then upon cooldown from the growth temperature, the III-V nitride and substrate are under considerable strain and the boule material and/or seed are prone to crack, but if growth is carried out on a TCE-matched and lattice-matched III-V nitride seed, unstrained growth can be carried out, and cooldown of the boule will occur without cracking. With sufficient supply of reactants and growth on TCE-matched seeds, boules can be grown that are several centimeters long.

Considerably lower defect density substrates is achievable by starting with lower defect density III-V nitride seeds produced by lateral epitaxial overgrowth (LEO).

LEO is carried out on substrates which have been patterned with growth inhibitor regions formed by deposition (e.g. $Si_3N_4$, W, or $SiO_2$) or etching (trenches). Growth selectivity between the masked (or etched) and window regions alter the growth direction and defect propagation of the III-V nitride. Dislocation annihilation occurs both through "blocking" at the growth inhibited regions, and through bending of the dislocations in the window region. Thus, lower defect density can occur not only over growth inhibiting regions, but also over window regions. A repeated LEO process with growth inhibiting stripes displaced to block the entire area of the seed may also be useful as a seed with uniformly low defect density.

(Ga,Al,In)N boules can be grown on previously grown LEO seeds or the boule process can include LEO growth as the first stage without removal of the LEO material from the reactor.

In the HVPE boule process, in addition to using high quality GaN seeds, it is important that the growth process be thermally uniform so that local strain is not induced. This may for example be achieved by using a relatively low growth temperature (e.g., from about 900 to about 1100° C.) and by using hot-walled reactor heating to maintain uniform temperature across the growing boule.

The efficient conversion of III-V nitride boules into wafers includes boule orientation, boule slicing, wafer sizing, wafer polishing, and wafer characterization. Concerning boule orientation, accurate wafer orientation is important for proper deposition of III-V nitride epilayers. Laue diffraction can be employed to determine crystal direction, and the polarity of the starting seeds and boule can be readily analytically determined using conventional techniques, e.g., surface analysis tools including AES, LEED, etching and XPS.

Following orientation, the boule is sliced into wafer blanks. A wire saw may be employed for this operation. The principle of a wire saw is to slice the boule by a lapping process. In this process a brass-coated steel wire is coated with abrasive (diamond/BC) slurry, the coated wire is run over the boule, and a small amount of boule material is removed with each pass. Alternately, an abrasive impregnated wire may be used. This process works as well if multiple wires are placed in parallel positions, e.g., 125 wires, which allows a corresponding level of slices to be taken from one or a set of boules in a single slicing operation.

The use of the wire saw in lieu of other slicing devices has three main advantages: (1) lower kerf loss from the slicing process; (2) higher boule throughput due to multi-wire slicing, and (3) reduced subsurface damage from the slicing process. Due to reduced kerf loss, the number of wafers that can be obtained from a single boule is very high.

Alternatively, the boule could be separated into individual wafers by thermally decomposing periodically placed parting layers. For example, the composition or doping level of the (Al,Ga,In)N boule can be controlled over the length of the boule such that periodic (e.g., every 0.3 to 0.5 mm of growth) absorptive layers (regions with lower bandgap or different dopant type or density) can be grown, in alternating arrangement to the wafer material layer or regions. Exposure of the resulting boule to high power laser energy with photon energy that is non-absorbed (or minimally absorbed) by the wafer material layer but preferentially or exclusively absorbed by the absorptive layer will cause thermal decomposition of the absorptive layer and separation of wafer material layer from the boule. This process can be sequentially carried out to separate each of the wafer layers in turn from the boule, optionally with removal of excess Group III materials from the surface of the boule (e.g., in HCl gas or liquid) before or during each successive laser separation step.

Following the slicing or partition process producing the discrete individual wafer body, the unwanted outer region of the wafer is removed in a sizing process. This cutting to size and edge rounding may be achieved by a computer-controlled micro-particle abrasion process. In such process two streams of micro-particles of abrasive, such as boron carbide, may be used to cut the as-sawn SiC wafers into circular wafers with the appropriate flats. The system is advantageously computer-controlled to yield accurate wafer diameter and flat lengths, as well as to produce edge-rounded wafers for enhanced crack and chip resistance Sizing could also occur before slicing, in which case a higher throughput may be achieved.

Polishing of the wafer involves preliminary polishing, e.g., using diamond slurries, followed by a post polish treatment to remove sawing and mechanical polish induced subsurface damage.

The wafer derived from the boule may be subjected to various other finishing operations, including, without limitation, core drilling, abrasive particle jet exposure, wire sawing, laser exposure, chemical mechanical polishing, etching, and reactive ion etching.

The present invention in one aspect contemplates the cleaving of the substrate for the microelectronic device or precursor device structure, to enable device articles such as laser diodes on free-standing material. Homostructures enable aligned cleavage planes between the device and substrate, thereby permitting cleavage. Cleaving can be facilitated by thinning of the substrate before cleaving.

The present invention offers various advantages over currently available and otherwise proposed technologies, including:

(1) the provision of low defect density material. The defect density of the final wafers is lower than those produced by currently available technologies since the defect density of the starting seed crystal is comparable to the best (Al,Ga,In)N available and the defects continue to annihilate as the boule grows.

(2) ready manufacturability of the product material and cost-effectiveness of the growth process. The need for a high pressure apparatus is eliminated by using vapor phase growth techniques, and multiple wafers are produced from each boule.

(3) capability of growing large area wafers. Large area seeds are already available and/or may be harvested from the process, to enable growth of boules with large cross-sectional area. The boule cross sectional area is made larger by using larger seeds. Furthermore, the single crystal area can progressively be increased during the growth, yielding larger seed for subsequent growth.

(4) additional degrees of freedom in the choice of substrate orientation. Substrate orientation can be chosen or optimized for improved epitaxial overgrowth or to accommodate specific device applications. Optimal wafer orientations may be selected to be N-face or Ga-face, and aligned with a principal crystallographic axis (e.g. c, a, m, or r) or slightly misaligned to create surface steps for epitaxial growth.

(5) controllability of electrical characteristics. The electrical characteristics of the boule material can be controlled to suit the particular device applications to which wafers cut from the boule will be subjected. Doping is simplified as compared to conventional boule growth since doping may be controlled by gas-phase flow rather than a difficult-to-control dopant concentration in the melt.

(6) ability to control lattice-matching between the seed and growing boule crystal by adjusting alloy composition of either precursor.

The features and advantages of the invention are more fully shown by the following non-limiting example, wherein all parts and percentages are by weight, unless otherwise specifically stated.

Example 1

GaN boules were grown on GaN seed crystals by hydride vapor phase epitaxy (HVPE) in a reactor system of the type shown schematically in FIG. 2. The Ga constituent was provided by interaction of HCl gas with molten Ga at ~850° C. to form a gaseous gallium chloride compound. Ammonia ($NH_3$) gas provided the nitrogen constituent.

The GaN seed crystals were produced by the HVPE/optical liftoff technique. The use of GaN seeds alleviated the strain associated with TCE and lattice mismatch and facilitated the growth of a long boule without cracking. The seed crystals were first reactive ion etched (RIE) in $SiCl_4$ to remove 0.5 μm of material and then cleaned with solvents and dilute HCl to remove surface contaminants and the native oxide from the GaN. Polishing of the seed crystals, or the use of as-grown smoother seeds, is preferred for best results. The seed was placed in the HVPE reactor and maintained under a flow of $NH_3$ until the growth was initiated. The wafer temperature was less than 993° C. during the growth nucleation, although higher temperatures may be used to advantage. Lower than ideal temperatures were employed in the first trial in order to make sure that the GaN material would not crack. The ratio of $NH_3$ to HCl flow during the process was maintained at ~35. Growth rates as high as 0.15 mm/hr were demonstrated.

A GaN boule was grown, 8 $cm^2$ in cross-section by 4 mm long on an irregularly shaped GaN seed. The initial results obtained demonstrated that GaN boules, substantially longer (thicker) than previous reports, can be growth without cracking and without appreciably reducing the crystal area of the starting GaN seed. The GaN boule material was robust enough to be mechanically transformed into individual wafers. Wafer slicing was accomplished by a wire-saw. Sizing of individual wafers was accomplished by sandblasting and the final wafer product was edge rounded. Wafer polishing was carried out with diminishing sizes of abrasives (diamond).

Several wafers were successfully fabricated from the initial GaN boule. The as-sliced wafer from the GaN boule had a transverse dimension of approximately 1.75 inches, and the as-cut wafer material was polished and sized to yield a 1 inch diameter wafer.

Figure 3:
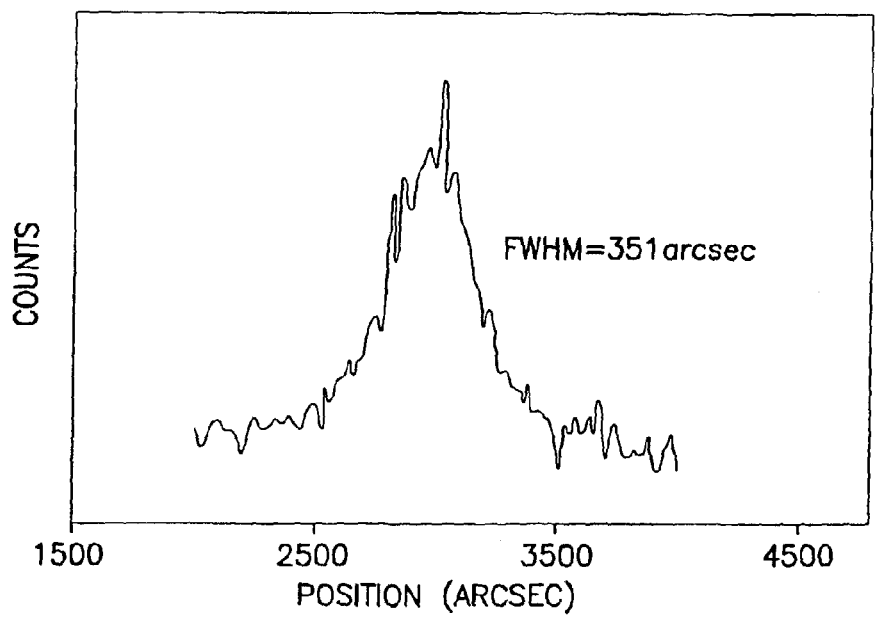
FIG. 3 is a double crystal x-ray rocking curve, for a GaN wafer produced by the HVPE boule manufacturing method according to one embodiment of the present invention.

The crystal quality of the wafers was good. Despite the use of intentionally low quality seed material (rough and pitted), minimal seed preparation, and a compromised process (growth temperature decreased with boule growth), the double crystal x-ray rocking curve full width at half maximum, FWHM (shown in FIG. 3), for the GaN wafer obtained from the HVPE boule manufacturing method was ~351 arc-sec, comparable to good quality GaN heteroepitaxial material. The background donor concentration in the first wafers compared favorably with other HVPE material, measuring less than $10^{16}$ $cm^{-3}$.

The foregoing example demonstrates a proof of principle of the boule manufacturing methodology of the present invention. An optimal implementation of the inventive method would include use of high quality, properly sized-seeds, optimized seed preparation, and the maintenance of a constant growth temperature in the growth process (involving seed retraction).

The foregoing example demonstrates the following characteristics of the invention:

Vapor phase growth—The HVPE growth process was carried out to deposit 4 mm of GaN material. Since growth in the vapor phase proceeds farther from equilibrium than conventional bulk growth techniques and the nitrogen precursor is continually supplied to the process, the need for a high pressure apparatus is eliminated.

High growth rate—Growth rates in excess of 0.15 mm/hr were demonstrated and higher growth rates (e.g., 2-4 times higher than demonstrated in this example) are achievable with enhanced $NH_3$ cracking and higher growth temperatures.

Large area—The boule cross-sectional area equaled that of the seed crystal. In the foregoing example, area of the seeds was limited to ~8 $cm^2$, but there is no barrier to scale-up of the process to larger diameters.

Crack-free—Growth on lattice-matched and TCE-matched seed crystals enabled the growth of 4 mm of GaN without cracking, in marked contrast to previous seeded growth on SiC or sapphire. The strain-free nature of the growth and cooldown was further demonstrated since initial cracks in the seed did not propagate during boule growth (they did not grow laterally or into the material of the new wafers).

Sliced wafers—The GaN boule was robust enough and of sufficient length to be sliced into individual wafers that were subsequently sized and polished to a specular finish. The resulting wafers are highly suitable for handling, epitaxial growth and device processing.

Good material quality—The crystal quality of the wafers was comparable to current heteroepitaxial GaN materials.

The foregoing example demonstrates the advantages and features of the invention. Various aspects of the invention are susceptible to optimization, including:

Seed preparation—There is an obvious change in structure of the GaN deposited on the seed. Optimized seed preparation and growth nucleation are appropriate to maximize the quality of the product boule.

Reactor design—The growth reactor desirably is constructed and arranged to uniformly grow the GaN boule at high growth rates, with efficient management of growth byproducts and with continuous reactant replenishment.

Crystal area—Edge preparation techniques are combined with higher growth temperature, higher $NH_3$/Ga ratios, lower pressures, desirable thermal gradients and non-uniform flow patterns, so that single crystal boule material is grown both in the direction perpendicular to the seed and in the direction parallel to the seed to expand crystal area. Alternately, edge coating techniques serving as lateral growth barriers are usefully employed to limit polycrystalline growth at the edges of the boule and encroachment of the single crystal area.

Wafer fabrication—Wafer fabrication unit operations (polishing, sawing, sizing, finishing, etc.) are susceptible to optimization within the skill of the art, to maximize the quality of the product wafers yielded by the boule.

The boule of the present invention may be parted or sectioned in any suitable manner to provide multiple device quality wafers which then may be employed as device-quality substrates for fabrication of a wide variety of microelectronic devices and device precursor structures, such as such as light emitting diodes, laser diodes, ultraviolet photodetectors, high electron mobility transistors, bipolar transistors, heterojunction bipolar transistors, high power rectifiers, wavelength division multiplexing components, etc. Several different types of such devices are illustratively described below.

Figure 4:
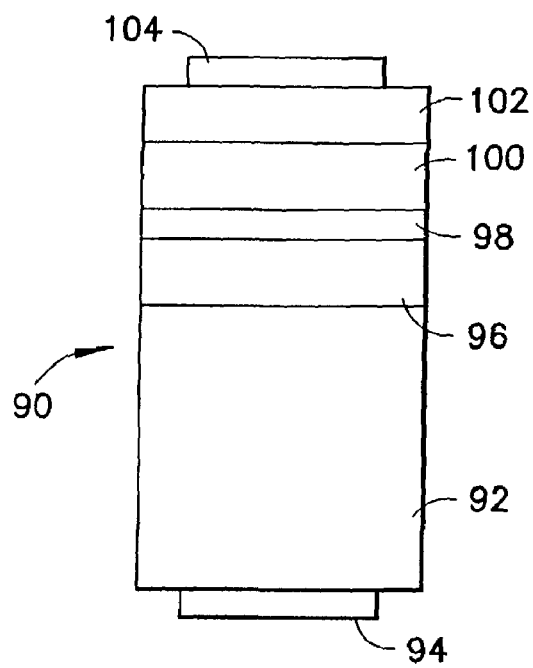
FIG. 4 is a schematic representation of a double heterostructure LED fabricated on a wafer derived from a boule of the invention.

FIG. 4 is a schematic representation of a double heterostructure LED 90 fabricated on a wafer 92 derived from a boule of the invention. The wafer, which may be an n-doped AlGaN material, has formed on its bottom surface an n-electrode 94. Overlying the top surface of the wafer are the sequential layers 96-104, including an n-AlGaN cladding layer 96, an undoped InGaN active region layer 98, a p-type AlGaN cladding layer 100, a p-type GaN contact layer 102 and a p-electrode 104.

Figure 5:
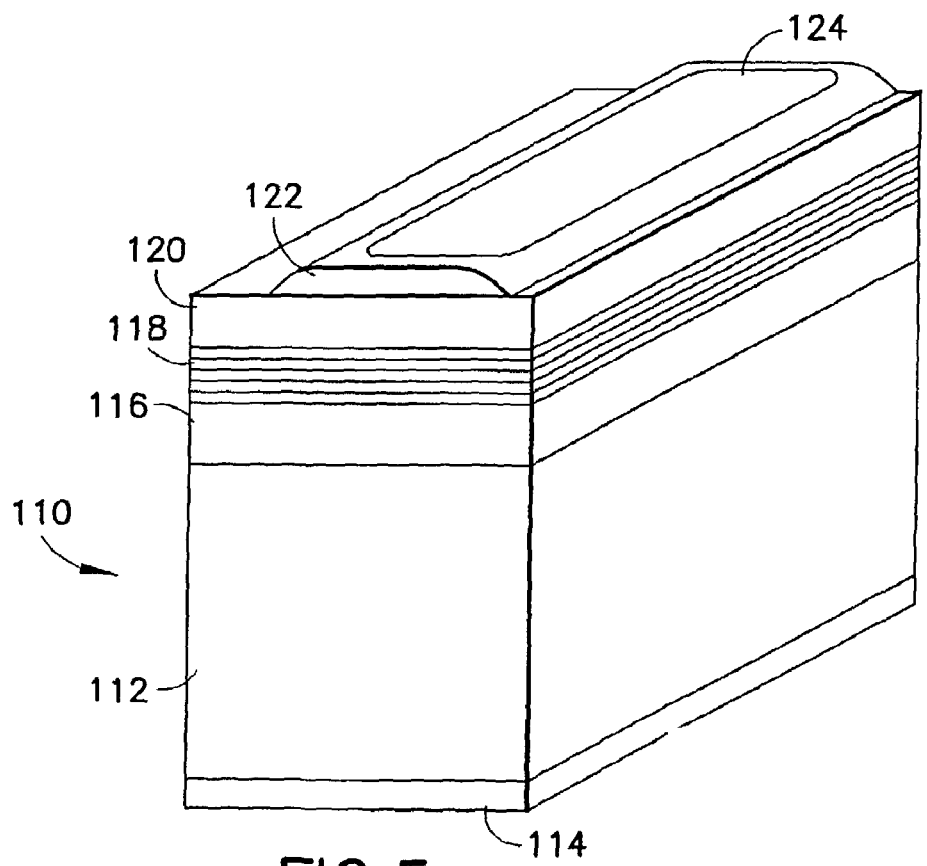
FIG. 5 is a schematic representation of a cleaved laser diode fabricated on a wafer derived from a boule of the invention.

FIG. 5 is a schematic representation of a cleaved laser diode 110 fabricated on a wafer 112 derived from a boule of the invention. The wafer 112 is of a p-type AlGaN material, with a large area p-contact electrode 114 on its bottom surface. Overlying the top surface of the wafer are the sequential layers 116-124, including a p-AlGaN cladding layer 116, a GaN/InGaN multiple quantum well active region layer 118, an n-type AlGaN cladding layer 120, an n-type GaN contact layer 122 and an n-electrode 124.

Figure 6:
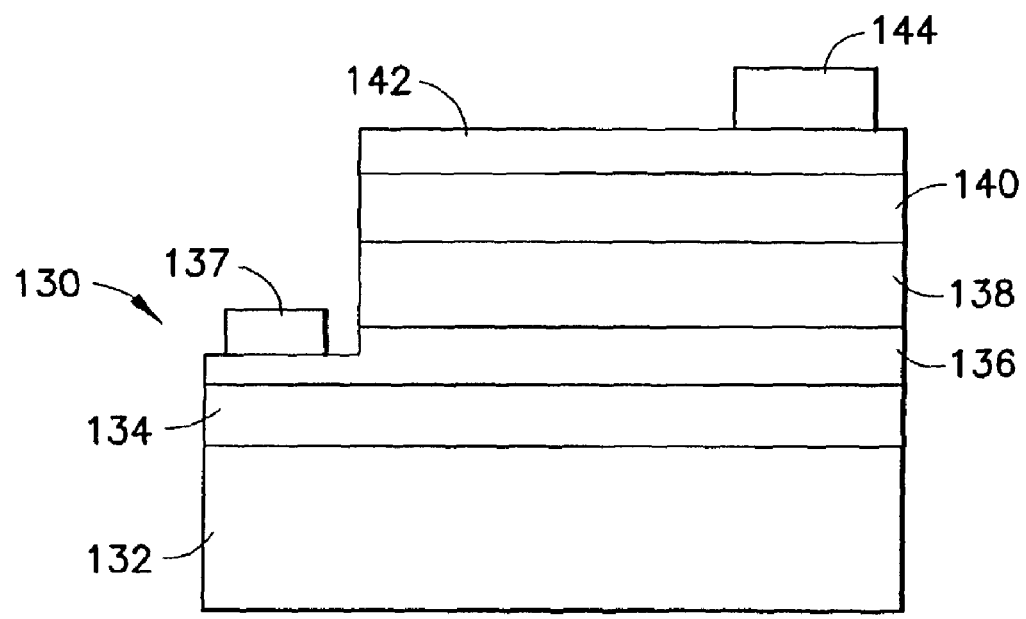
FIG. 6 is a schematic representation of an ultraviolet photodetector fabricated on a wafer derived from a boule of the invention.

FIG. 6 is a schematic representation of an ultraviolet photodetector 130 fabricated on a wafer 132 derived from a boule of the invention. The wafer 132 is formed of an $Al_{x1}Ga_{1-x1}N$ material, wherein $x_1 > x_2 + 0.05$. Overlying the substrate are the sequential layers 134-137, including n-type $Al_{x1}Ga_{1-x1}N$ material layer 134, n-type $Al_{x2}Ga_{1-x2}N$ material layer 136, n-electrode 137, an insulative (undoped) $Al_{x2}Ga_{1-x2}N$ material layer 138, a p-type $Al_{x2}Ga_{1-x2}N$ material layer 140, a p-type GaN material layer 142 (or a layer graded to p-type GaN), and p-electrode 144.

Figure 7:
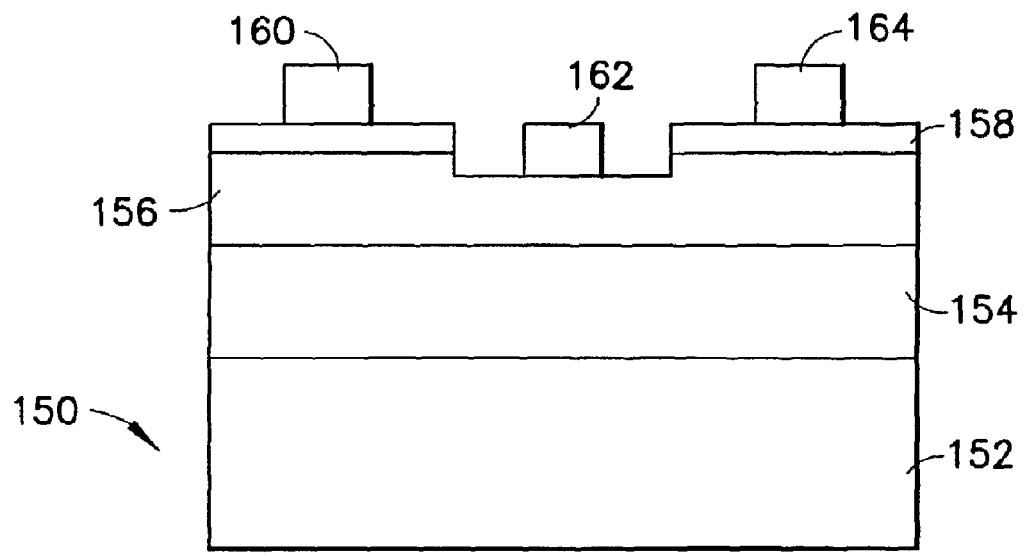
FIG. 7 is a schematic representation of a high electron mobility transistor fabricated on a wafer derived from a boule of the invention.

FIG. 7 is a schematic representation of a high electron mobility transistor 150 fabricated on a semi-insulating GaN wafer 152 derived from a boule of the invention. Overlying the wafer 152 are sequential layers 154-158 including undoped GaN layer 154, undoped AlGaN layer 156 which may have a thickness on the order of less than 100 Angstroms, and n$^+$ AlGaN layer 158 which may have a thickness on the order of about 200 Angstroms. The device structure includes drain electrode 160, gate electrode 162 and source electrode 164, as shown.

Figure 8:
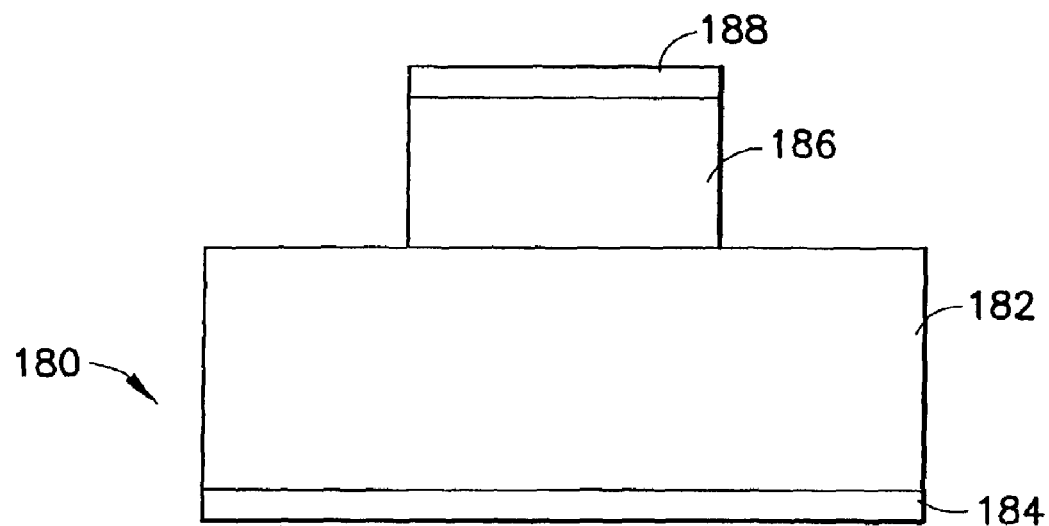
FIG. 8 is a schematic representation of a high power rectifier fabricated on a wafer derived from a boule of the invention.

FIG. 8 is a schematic representation of a high power rectifier 180 fabricated on an n-type (Al,Ga,In)N wafer 182 derived from a boule of the invention. Underlying the wafer is an ohmic contact 184, and overlying it are an n-type (Al,Ga,In)N stand-off layer 186 and Schottky contact 188.

Figure 9:
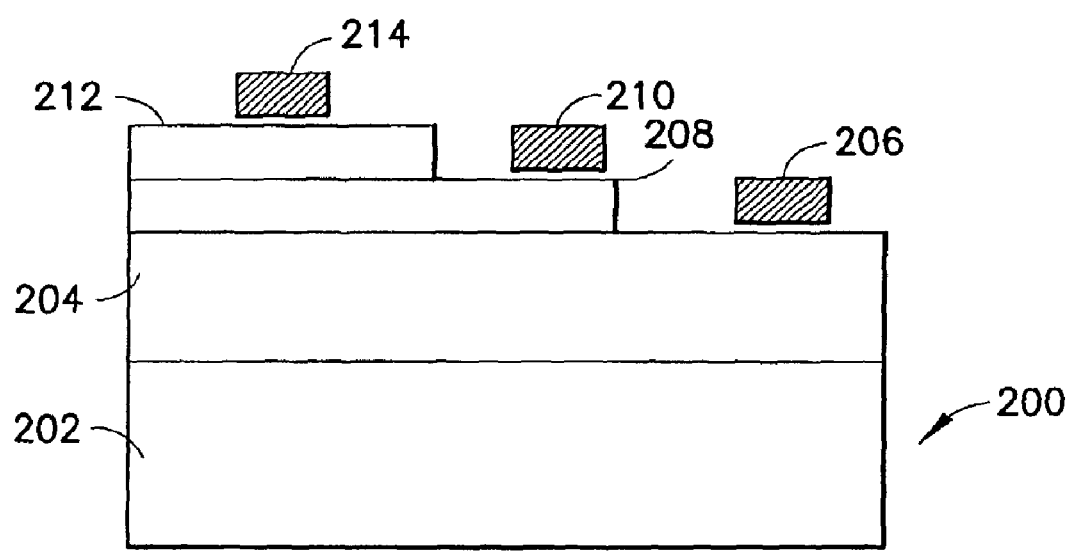
FIG. 9 is a schematic representation of an AlGaN/GaN heterojunction bipolar transistor fabricated on an n-type GaN wafer derived from a boule according to one embodiment of the present invention.

FIG. 9 is a schematic representation of an AlGaN/GaN heterojunction bipolar transistor 200 fabricated on an n-type GaN wafer 202 derived from a boule according to the present invention. The device structure includes an n-type GaN collector 204, collector contact 206, thin (e.g., 100 to 300 nm thickness) p-type GaN base region 208, and base electrode 210. Overlying the base region are the n-type AlGaN emitter 212 and emitter electrode 214. The junction between the emitter and base material may be graded from the GaN of the base 208 to the AlGaN composition of the emitter 212 to avoid abrupt discontinuity in the conduction band at this junction.

While the present invention is described herein in reference to the fabrication and use of boules as bulk growth bodies from which multiple microelectronic device-quality wafers can be produced by partition or subdivision, it will be appreciated that various of the described techniques have applicability to single wafer fabrication processes. For example, GaN single wafers can be produced by growth of thick (e.g., 300-500 microns) GaN on sapphire, and subsequent parting of the GaN layer from the sapphire substrate, with the resulting GaN layer constituting a wafer for subsequent processing, In this case, additional epitaxial layers could be grown on the surface of the substrate, either within the HVPE system prior to separation from the seed, or in a different process step subsequent to removal from the HVPE system. Such formation of single wafer structures is amenable to process operations of various types described herein, including for example doping, polishing and sizing steps.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A III-V nitride article comprising a boule, wafer, or epitaxial layer, doped by nuclear transmutation doping to yield a room temperature electron concentration of from 1E15 to 5E19 cm$^{-3}$, wherein the III-V nitride comprises at least one of Al and Ga, and an effective amount of Al or Ga metal atoms originally present in the article have been converted to a dopant element as a result of said nuclear transmutation doping, and the III-V nitride article further comprises an epitaxially compatible non-native seed crystal or substrate.

2. The (Al,Ga,In)N article of claim 1, having a surface offcut at an angle from the (0001) plane toward the <1$\bar{1}$00> direction or the <11$\bar{2}$0> direction.

3. The III-V nitride article of claim 1, having a surface offcut of up to 10 degrees from a primary crystal axis.

4. The III-V nitride article of claim 1, grown on a seed crystal having an orientation selected from the group consisting of c-axis, a-axis, m-axis, r-axis, and offcut at a nonzero angle less than 10 degrees from a primary crystal axis.

5. A III-V nitride article according to claim 1, comprising a boule having a thickness of at least 4 mm.

6. A III-V nitride article according to claim 1, characterized by a transverse dimension of at least 1.75 inches or a diameter of at least 1 inch.

7. A III-V nitride article according to claim 1, having a surface defect density of less than $10^7$ cm$^{-2}$.

8. A III-V nitride article according to claim 1, having a surface defect density of less than $10^6$ cm$^{-2}$.

9. A III-V nitride article according to claim 1, having a surface defect density of less than $10^5$ defects cm$^{-2}$, and a diameter of at least 5 centimeters.

10. A III-V nitride article according to claim 1, comprising a wafer or epitaxial layer having a surface with an RMS roughness of less than 5 Angstroms over a 10×10 micrometers$^2$ area.

11. A III-V nitride article of claim 10, having a radius of curvature of greater than 1 meter.

12. A microelectronic device fabricated in or on a III-V nitride article comprising a wafer or epitaxial layer according to claim 1.

13. The microelectronic device of claim 12, selected from the group consisting of light emitting diodes, laser diodes, ultraviolet photodetectors, high electron mobility transistors, bipolar transistor, heterojunction bipolar transistor, wavelength division multiplexing components, and high power rectifiers.

14. A method comprising nuclear transmutation doping of a III-V nitride article comprising a boule, wafer, or epitaxial layer, wherein the III-V nitride comprises at least one of Al and Ga, and the method converts an effective amount of Al or Ga metal atoms originally present in the article to a dopant element as a result of said nuclear transmutation doping, further comprising one of the following steps (a) and (b):

(a) growing the III-V nitride article with a feed material comprising isotopically pure $_{31}^{71}$Ga; and (b) growing the III-V nitride article on an epitaxially compatible non-native seed crystal or substrate.

15. A method according to claim 14, comprising growing the III-V nitride article with a feed material comprising isotopically pure $_{31}^{71}$Ga.

16. A method according to claim 15, further comprising growing the III-V nitride article on a III-V nitride seed crystal or substrate.

17. A method according to claim 14, further comprising diffusion of n-type, p-type, or deep level impurities at a temperature greater than 600 degrees C.

18. A method according to claim 14, comprising nuclear transmutation doping of a III-V nitride article comprising a boule.

19. A method according to claim 18, further comprising deriving a plurality of wafers from the boule following the nuclear transmutation doping.

20. A method according to claim 19, further comprising fabricating a microelectronic device structure on at least one wafer of the plurality of wafers.

21. A method according to claim 14, comprising nuclear transmutation doping of a III-V nitride article comprising a wafer or epitaxial layer.

22. A method according to claim 21, further comprising fabricating a microelectronic device structure on the wafer or epitaxial layer.

23. A method according to claim 14, further comprising growing the III-V nitride article via vapor phase epitaxy.

24. A method according to claim 14, further comprising growing the III-V nitride article on a seed crystal or substrate offcut up to 10 degrees from a primary crystal axis.

25. A method according to claim 14, further comprising offcutting the III-V nitride article at an angle of less than 10 degrees from a primary crystal axis.

26. A method according to claim 14, further comprising processing an a III-V nitride article comprising a wafer or epitaxial layer to yield a surface having an RMS roughness of less than 5 Angstroms over a 10×10 micrometers$^2$ area.

27. A method according to claim 14, comprising growing the III-V nitride article on an epitaxially compatible non-native seed crystal or substrate.

\* \* \* \* \*

UNITED STATES PATENT AND TRADEMARK OFFICE
CERTIFICATE OF CORRECTION

| | | |
|---|---|---|
| PATENT NO. | : 7,915,152 B2 | Page 1 of 1 |
| APPLICATION NO. | : 12/698144 | |
| DATED | : March 29, 2011 | |
| INVENTOR(S) | : Robert P. Vaudo | |

It is certified that error appears in the above-identified patent and that said Letters Patent is hereby corrected as shown below:

Title Page 2, Item (56), References Cited, Other Publications, second column, twenty-third entry: "AIN Single Crystals" should be -- AlN Single Crystals --.

Title Page 2, Item (56) References Cited, Other Publications, second column, twenty-fifth entry: "AIN wafers fabricated by HVPE" should be -- AlN wafers fabricated by HVPE --.

Column 19, line 65: "chip resistance Sizing" should be -- chip resistance. Sizing --.

Column 24, line 12 (claim 1): "AI and Ga, and an effective amount of AI or Ga" should be -- Al and Ga, and an effective amount of Al or Ga --.

Column 24, line 57 (claim 14): "an effective amount of AI" should be -- an effective amount of Al --.

Signed and Sealed this
Twenty-eighth Day of June, 2011

David J. Kappos
*Director of the United States Patent and Trademark Office*